United States Patent
Ge

(10) Patent No.: US 8,158,448 B2
(45) Date of Patent: Apr. 17, 2012

(54) RESONATOR AND METHODS OF MAKING RESONATORS

(75) Inventor: Howard H. Ge, Hacienda Heights, CA (US)

(73) Assignee: The Boeing Company, Chicago, IL (US)

( * ) Notice: Subject to any disclaimer, the term of this patent is extended or adjusted under 35 U.S.C. 154(b) by 289 days.

(21) Appl. No.: 12/430,588

(22) Filed: Apr. 27, 2009

(65) Prior Publication Data

US 2010/0270632 A1    Oct. 28, 2010

(51) Int. Cl.
*H01L 21/00* (2006.01)

(52) U.S. Cl. ...... 438/51; 438/52; 438/700; 257/E21.214

(58) Field of Classification Search .............. 438/50–52, 438/719, 770, 773; 257/417, E29.324, E21.214
See application file for complete search history.

(56) References Cited

U.S. PATENT DOCUMENTS

| | | | |
|---|---|---|---|
| 7,040,163 B2 | 5/2006 | Shcheglov et al. | |
| 7,168,318 B2 | 1/2007 | Challoner et al. | |
| 7,347,095 B2 * | 3/2008 | Shcheglov et al. | 73/504.13 |
| 7,401,397 B2 | 7/2008 | Shcheglov et al. | |
| 2003/0066946 A1 * | 4/2003 | Grimbergen | 250/205 |
| 2004/0106256 A1 * | 6/2004 | Dong et al. | 438/257 |
| 2007/0042510 A1 * | 2/2007 | Yoo | 438/14 |
| 2007/0109656 A1 | 5/2007 | Aubin et al. | |
| 2008/0003750 A1 * | 1/2008 | Kim et al. | 438/266 |
| 2008/0295622 A1 | 12/2008 | Challoner | |

FOREIGN PATENT DOCUMENTS

WO    WO 2007/072409 A2 *    6/2007

OTHER PUBLICATIONS

Circumferential—Definition by the Free Online Dictionary, Thesaurus and Encyclopedia, 2011, http:/wwww.thefreedictionary.com/Circumferential, 1 page.*
MEMS Resonators Look to Displace Quartz Resonators, Intellectual Property—MEMS Manufacturing, www.mems-manufacturing.com, Jul. 2006, pp. 11-14.

* cited by examiner

*Primary Examiner* — Tuan N. Quach
(74) *Attorney, Agent, or Firm* — Toler Law Group

(57) ABSTRACT

A resonator and method of making a resonator are provided. A particular method includes etching a silicon substrate to form a resonator structure. The resonator structure includes at least one resonator beam. The method also includes converting at least a portion of the at least one resonator beam to dry oxide.

18 Claims, 7 Drawing Sheets

RESONATOR AND METHODS OF MAKING RESONATORS

FIELD OF THE DISCLOSURE

The present disclosure is generally related to resonators and methods of making resonators.

BACKGROUND

Electromechanical gyroscopes are used to determine direction of a moving platform based upon the sensed inertial reaction of an internally moving proof mass. An electromechanical gyroscope may include a suspended proof mass, gyroscope case, pickoffs, torquers and readout electronics. The inertial proof mass is internally suspended from the gyroscope case that is rigidly mounted to a platform (such as a vehicle). The gyroscope case communicates inertial motion of the platform to the proof mass while otherwise isolating the proof mass from external disturbances. The pickoffs sense the internal motion of the proof mass and the torquers maintain or adjust the internal motion. The readout electronics may be in close proximity to the proof mass. For example, the readout electronics may be internally mounted to the case. The case provides electrical connections to platform electronics and to a power supply. The case may also provide a mechanical interface to attach and align the gyroscope with the vehicle platform. In various forms gyroscopes may be employed as a sensor for vehicles such as aircraft and spacecraft. They are generally useful for navigation and to autonomously determine the orientation of a free object.

Older mechanical gyroscopes tended to be relatively heavy mechanisms that employed relatively large spinning masses. More recently, some planar resonator gyroscope devices have been developed (such as, disc resonator gyroscopes). Planar resonator gyroscopes may operate through excitation and sensing of in-plane vibrational modes of a substantially solid planar resonator. For example, a planar resonator may be formed of a material such as silicon or quartz.

SUMMARY

In a particular embodiment, a system includes a mounting substrate and a resonator structure coupled to the mounting substrate. The resonator structure is formed of a silicon substrate. The resonator structure includes a resonator beam including dry silicon oxide. The resonator structure also includes a mounting portion including an at least partially oxidized portion of the silicon substrate.

In another particular embodiment, a method includes etching a silicon substrate to form a resonator structure. The resonator structure includes at least one resonator beam. The method also includes at least partially converting the at least one resonator beam to dry oxide. In a particular illustrative embodiment, an interior portion of the at least one resonator beam may remain unoxidized to form a thin conductive core.

In yet another particular embodiment, a resonator is formed by a process including etching a silicon substrate to form a resonator structure. The resonator structure includes at least one resonator beam. The process further includes at least partially converting the at least one resonator beam to dry oxide. In a particular illustrative embodiment, an interior portion of the at least one resonator beam may remain unoxidized to form a thin conductive core.

DETAILED DESCRIPTION

In a particular embodiment, a system includes a mounting substrate and a resonator structure coupled to the mounting substrate. The resonator structure is formed of a silicon substrate. The resonator structure includes a resonator beam including dry silicon oxide. The resonator structure also includes a mounting portion including an at least partially oxidized portion of the silicon substrate.

In another particular embodiment, a method includes etching a silicon substrate to form a resonator structure. The resonator structure includes at least one resonator beam. The method also includes at least partially converting the at least one resonator beam to dry oxide. In a particular illustrative embodiment, an interior portion of the at least one resonator beam may remain unoxidized to form a thin conductive core.

In yet another particular embodiment, a resonator is formed by a process including etching a silicon substrate to form a resonator structure. The resonator structure includes at least one resonator beam. The process further includes at least partially converting the at least one resonator beam to dry oxide. In a particular illustrative embodiment, an interior portion of the at least one resonator beam may remain unoxidized to form a thin conductive core.

Figure 1:
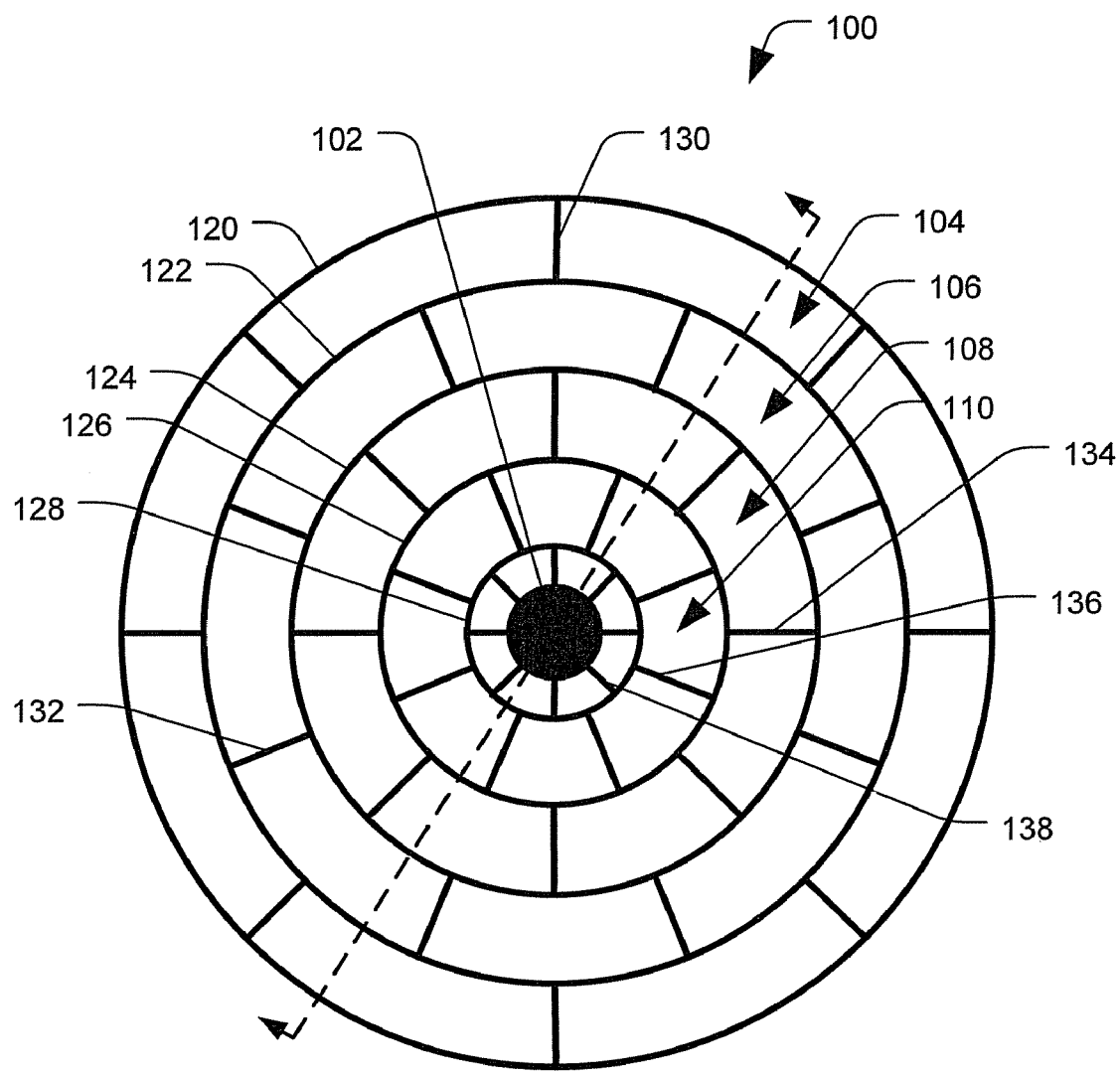
FIG. 1 is a schematic top view of a particular embodiment of a resonator.

FIG. 1 depicts a schematic top view of a particular embodiment of a resonator, designated 100. The resonator 100 may be used for a gyroscope or inertial sensor. The resonator 100 is supported by a rigid central support 102 and is configured for in-plane vibration. In a particular embodiment, the resonator 100 includes a disc that includes a number of slots, e.g. slots 104-110, formed from concentric circumferential segments 120-128. The circumferential segments 120-128 are supported by radial segments 130-138.

In a particular embodiment, the circumferential segments 120-128, the radial segments 130-138, or both may be referred to as "beams" of the resonator 100. Generally, it is desirable for the beams of the resonator to have a high quality factor (also called "Q factor" or "Q value"). The Q factor is a dimensionless parameter that relates energy stored by the resonator 100 to energy lost per cycle. Thus, at a particular oscillation frequency, a resonator with a higher Q factor dissipates energy slower than a resonator with a lower Q factor resonator.

The Q factor of the resonator 100 may be dependent upon materials from which the resonator 100 is constructed. For example, resonators made from silicon have a relatively lower Q factor than resonators made from quartz. Also, resonators made from fused silica or silicon dioxide may have a higher Q factor than resonators made from silicon. However, various materials may be more difficult to process in order to form the resonator 100. In a particular embodiment, the resonator 100 is formed using a silicon substrate and subsequently oxidized to increase the Q factor of the resonator 100. For example, after the resonator 100 is etched from the silicon substrate, the resonator 100 may be oxidized until the beams (i.e., the circumferential segments 120-128, the radial segments 130-138, or both) of the resonator 100 are at least partially oxidized. In an illustrative embodiment, a relatively narrow portion of the center of one or more of the beams may remain unoxidized leaving at least a thin silicon core. Additionally, the rigid central support 102 may be at least partially oxidized. The resonator 100 may also be annealed after the beams are at least partially oxidized. After oxidation of the beams, the Q factor of the resonator 100 may be substantially improved. Thus, relatively low cost processes, such as reactive-ion etching, may be used to form the resonator 100 from silicon and the Q factor of the resonator 100 may be subsequently increased by oxidizing the beams of the resonator 100.

Figure 2:
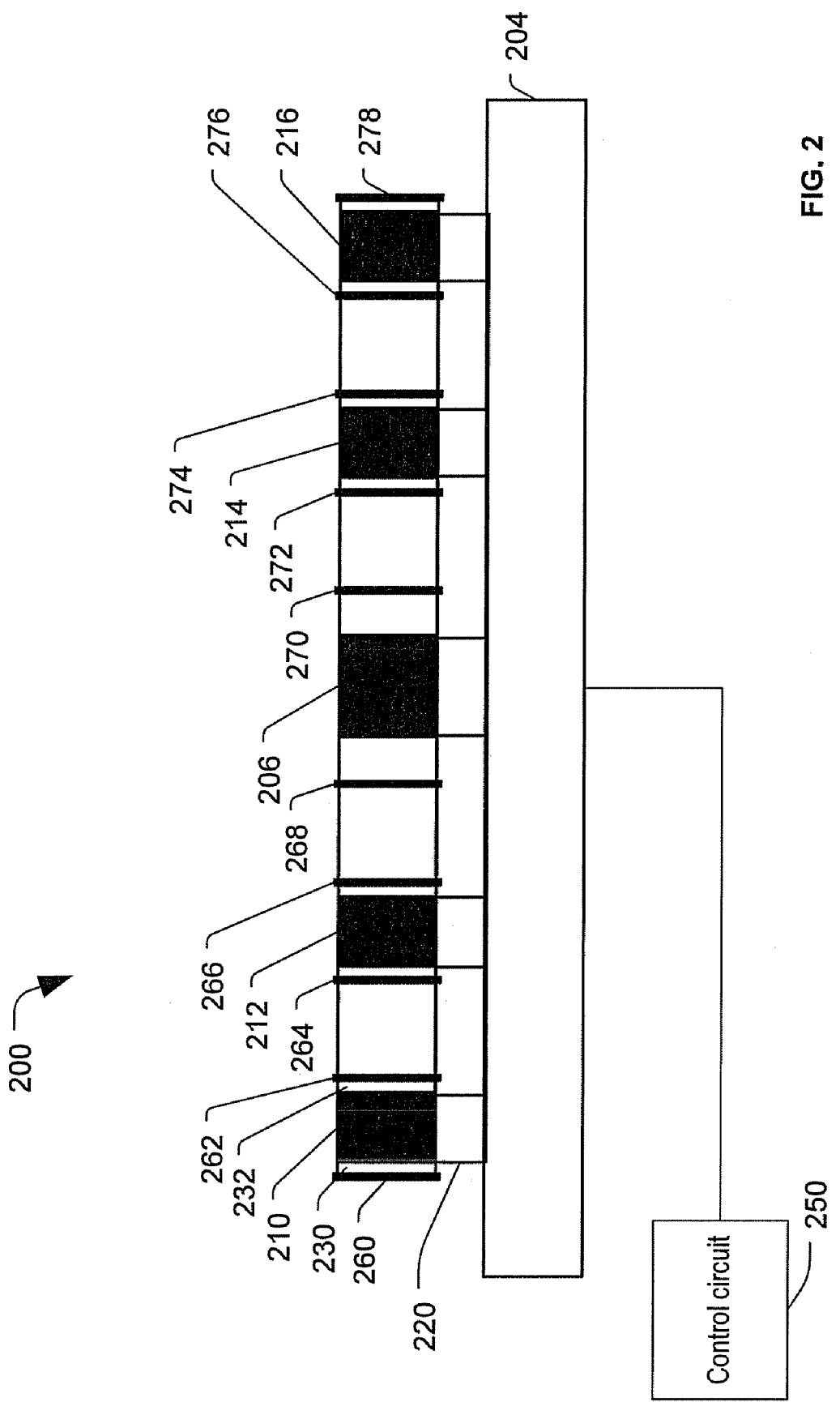
FIG. 2 is a schematic cutaway side view of a particular embodiment of a resonator.

FIG. 2 depicts a schematic cutaway side view of a particular embodiment of a resonator, designated 200. The resonator 200 is coupled to a base plate 204 (also referred to as a mounting substrate) at a central support 206 (also referred to as a mounting portion) of the resonator 200. The resonator 200 may include a plurality of slots (such as the slots 104-110 illustrated in FIG. 1) separating circumferential segments 260-278 of the resonator 200. The resonator 200 may also include one or more embedded electrodes 210-216 between the circumferential segments 260-278. The embedded electrodes 210-216 may be supported by pillars 220 on the base plate 204. In a particular embodiment, the embedded electrodes 210-216 form capacitive gaps with respect to adjacent circumferential segments 260-278. For example, a first capacitive gap 230 is formed between the first electrode 210 and the first circumferential segment 260. Likewise, a second capacitive gap 232 is formed between the first electrode 210 and the second circumferential segment 262. Other capacitive gaps are formed between others of the circumferential segments 264-278 and the adjacent electrodes 212-216. The first capacitive gap 230 may be referred to as an outboard gap since the first capacitive gap 230 is at a location further from the center of the resonator 200 than the first electrode 210. Conversely, the second capacitive gap 232 may be referred to as an inboard gap since the second capacitive gap 232 is at a location closer to the center of the resonator 200 than the first electrode 210. Each of the other capacitive gaps may also be identified as inboard or outboard gaps depending on their location with respect to the center of the resonator 200 and with respect to an associated electrode adjacent to the gap.

In a particular embodiment, the embedded electrodes 210-216 provide for radial excitation of the resonator 200 as well as sense motion of the resonator 200. Each of the electrodes 210-216 may be divided into two or more separate elements to improve control and sensing of the resonator 200. For example, the first electrode 210 may be divided into two or more elements, with at least one of the elements adapted to act across the first capacitive gap 230 and at least one of the elements adapted to act across the second capacitive gap 232. Vibration may be induced in the resonator 200 by separately exciting the two or more elements of the first electrode 210 to produce a biased reaction on the resonator 200 at the first electrode 210 location.

One or more of the other electrodes 212-216 may also be used to induce vibration in the resonator. In a particular embodiment, the electrodes positioned closer to the center of the resonator, such as the second electrode 212 and the third electrode 214 may be used to excite the resonator 200 (that is, to induce vibration in the resonator 200).

In this embodiment, electrodes positioned further from the center of the resonator 200 may be used for sensing vibration of the resonator 200. For example, the first electrode 210 and the fourth electrode 216 may be used to sense vibration of the resonator 200. However, the specific arrangement and distribution of excitation and sensing electrodes may be varied depending on the particular application or configuration of the resonator 200. Additionally, in certain embodiments, additional electrodes (not shown), either embedded within the resonator 200 or external to the resonator 200, can also be used to bias the resonator 200 providing electrostatic tuning or trimming of non-uniformity. Such biasing electrodes can also include multiple separate elements as the excitation and sensing electrodes.

In a particular embodiment, the resonator 200 and the embedded electrodes 210-216 are formed using a silicon substrate. For example, a reactive-ion etch or wet etch process may be used to simultaneously etch the resonator 200 and the embedded electrodes 210-216 from a silicon substrate. The silicon substrate may subsequently be oxidized to increase the Q factor of the resonator 200 and of the embedded electrodes 210-216. In a particular embodiment, the silicon substrate is oxidized until beams of the resonator 200, such as the circumferential segments 260-278, are at least partially oxidized. To illustrate, the silicon substrate may be oxidize leaving a relatively thin interior conductive core. Additionally, the central support 206 (or mounting portion) of the silicon substrate may be at least partially oxidized. Thus, relatively low cost processes may be used to simultaneously form the resonator 200 and the embedded electrodes 210-216 from silicon and the Q factor of the resonator 200 may subsequently be increased by oxidizing the silicon substrate.

In operation, one or more of the electrodes (such as the second electrode 212, the third electrode 214, one or more other electrodes, or any combination thereof) may be used to drive vibration modes of the resonator 200. Additionally, one or more of the electrodes (such as the first electrode 210, the fourth electrode 216, one or more other electrodes, or any combination thereof) may be used to sense reactions to movement in the vibration modes of the resonator 200. For example, the electrodes 210-216 may be electrically coupled to a control circuit 250. Electrical connections to couple the electrodes 210-216 to the control circuit 250 may be routed in any manner. For example, the electrical connections may be provided by etched conductive traces on the surface of the base plate 204 to wire bonds (not shown) from one edge of the base plate 204. Alternately (or in addition) one or more of the electrical connections may be routed through vertical vias (not shown) through a central region of the base plate 204. The control circuit 250 may drive electrodes used to excite the resonator 200 and to gather, process, or sense information from sensing electrodes.

Figure 3:
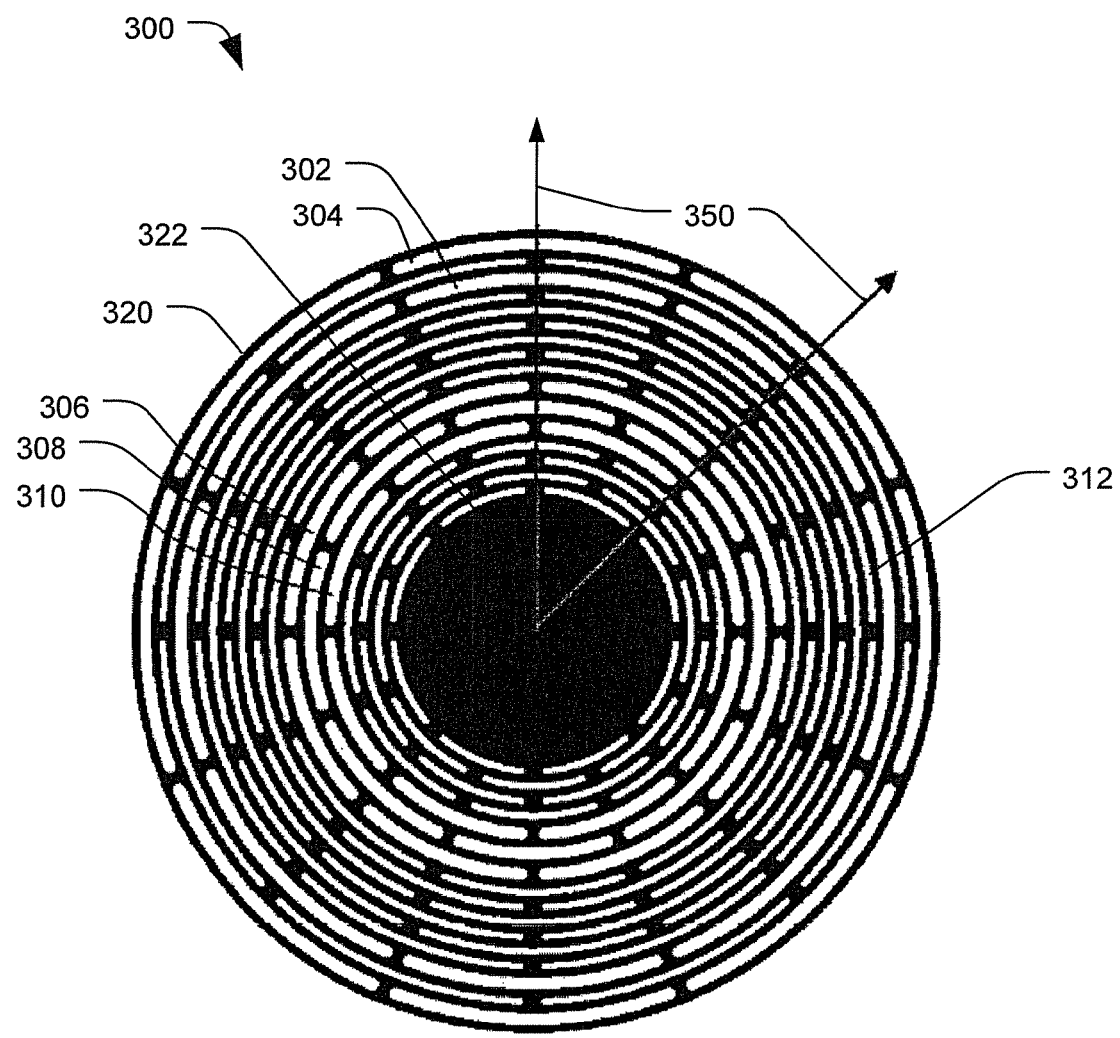
FIG. 3 is an illustration of a particular embodiment of a pattern for an exemplary resonator.

FIG. 3 illustrates a particular embodiment of a pattern for an exemplary resonator, designated 300. The pattern 300 includes numerous concentric, interleaved circumferential slots 302-312. For example, the slots 302-312 may be etched through a substrate to leave a plurality of circumferential rings 320 and a central mounting portion 322. In a particular embodiment, some of the slots, such as slots 302-310, are wider that others, such as narrow slot 312, to accommodate multiple element electrodes (not shown). For example, outer wide slots 302-304 may include sensing electrodes, such as the sensing electrodes described with reference to FIG. 2, and inner wide slots may include excitation electrodes, such as the excitation electrodes described with reference to FIG. 2. The narrower slots, such as slot 312, may serve to electrically tune the resonator (e.g., to lower an oscillation frequency of the resonator). In a particular embodiment, one or more of the narrower slots may also be occupied by sensing or excitation electrodes, or one or more wider slots may not include an electrode. The pattern 300 gives the resonator modal axes 350 that may be identified by operation of the resonator.

Although the pattern 300 is illustrated as a disc, other planar shapes and geometries using internal sensing and actuation with embedded electrodes are also possible. In addition, although the pattern 300 illustrated includes the single central mounting portion, other mounting configurations using one or more additional mounting supports may be used.

In a particular embodiment, a centrally supported cylinder or disc (also referred to as a resonator structure) formed of a silicon substrate is generated according to the pattern 300. Processes to form the pattern 300 using a silicon substrate are relatively inexpensive, such as reactive-ion etching; however, the Q factor of silicon is relatively low. By oxidizing the resonator structure until the circumferential rings 320 are substantially oxidized, a resonator having a higher Q factor can be formed.

In the in-plane design illustrated by the pattern 300, the central mounting portion 322 may be bonded to a mounting substrate in a manner that does not carry vibratory loads, thus reducing friction and anchor loss variability. In addition, the pattern 300 enables simultaneous photolithographic machining of the resonator and electrodes in a silicon substrate. Furthermore, certain electrode capacitances may be summed to reduce vibration rectification and axial vibration does not change capacitance to a first order. Modal symmetry may also be determined by photolithographic symmetry rather than by wafer thickness. Additionally, isolation and optimization of sense capacitance (e.g., from the outer slots 302-304) and drive capacitance (e.g., from the inner slots 306-310) may be achieved. Further, the pattern 300 may be geometrically scalable to smaller or larger diameters and to thinner or thicker wafers. Resonator structures can be formed, in certain embodiments, using an anisotropic silicon substrate that produces frequency splits. For example, a <111> silicon wafer and/or a varied slot width can be used. Further, the Q factor of the resonator structure can be increased by oxidizing the circumferential rings or other portions of the resonator structure.

Figure 4:
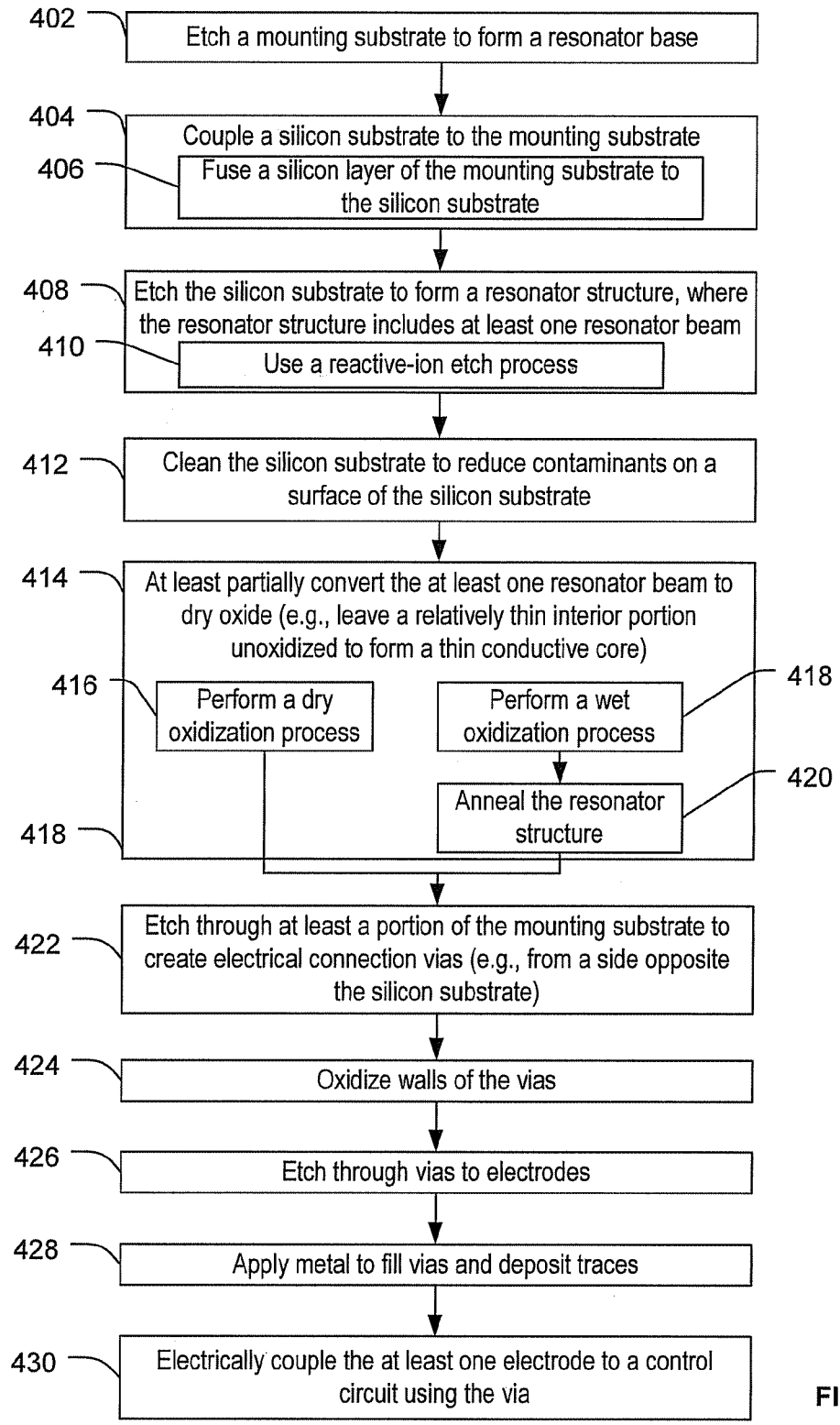
FIG. 4 is a flow diagram of a first particular embodiment of a method of forming a resonator.

FIG. 4 depicts a flow diagram of a first particular embodiment of a method of forming a resonator. In the particular embodiment, the method includes, at 402, etching a mounting substrate to form a resonator base. The mounting substrate may include a silicon on insulator (SOI) wafer having a silicon top layer, a silicon oxide intermediate layer, and a silicon base layer. The resonator base may be formed to include a mounting area that will support a resonator structure. The resonator base may further include one or more electrode bases to support electrodes in the resonator structure. Additionally, the resonator base may include one or more base caps to support a cover or cap that may be coupled to the resonator base to encapsulate the resonator structure.

In a particular embodiment, the method also includes, at 404, coupling a silicon substrate to the mounting substrate after forming the resonator base. For example, the top silicon layer of the mounting substrate may be fusion bonded to the silicon substrate, at 406.

The method may also include, at 408, etching the silicon substrate to form a resonator structure. The resonator structure may include at least one resonator beam. Additionally, the resonator structure may include a mounting area and one or more electrodes. For example, a pattern, such as the pattern 300 described with reference to FIG. 3, may be etched into or through the silicon substrate. In another example, the resonator structure may include or be similar to the resonator 100 or the resonator 200 described with reference to FIG. 1 and FIG. 2, respectively. For example, the at least one resonator beam may include a circumferential segment or a radial segment, as described with reference to FIG. 1 or any other structure between openings or slots formed in the resonator structure.

In a particular embodiment, the resonator structure may be etched using a reactive ion etch process, at 410. In another particular embodiment, a wet etch, a physical process, or a combination of processes may be used to form the resonator structure in the silicon substrate.

The method may include, at 412, cleaning the silicon substrate after etching the silicon substrate to form the resonator structure. Cleaning the substrate after etching may help to reduce contaminants on a surface of the silicon substrate.

The method may further include, at 414, converting the at least one resonator beam to dry oxide. In a particular embodiment, the at least one resonator beam may be partially converted to oxidized. For example, a relatively thin interior portion may be left unoxidized forming a thin conductive core).

Various oxidation processes may be used. For example, at 416, a dry oxidization process may be performed. The dry oxidation process may include placing the resonator structure in an oxidation furnace with oxygen as a process gas. The oxidation furnace may process the resonator structure for over 2000 hours at about 1050 degrees centigrade to form an oxide layer with a thickness of about 7 to 8 μm. The process conditions may be varied according to dimensions of the resonator beams to establish an endpoint of the oxidation process after the resonator beams are substantially oxidized.

In other example, at 418, a wet oxidization process may be performed. The wet oxidation process may include processing the resonator structure in a wet furnace with oxygen and hydrogen at a predetermined stoichiometric ratio as process gases. The resonator structure may be processed in the wet furnace for about 170 hours at 1050 degrees centigrade to form an oxide layer with a thickness of about 7 to 8 μm. When the wet oxidation process is used, the method may include, at 420, annealing the resonator structure. The annealing process may reduce water bound to the silicon oxide formed by the oxidation process. Additionally, the annealing process may relieve stress induced in the resonator structure by the oxidation processes. In an illustrative embodiment, the resonator structure may be annealed in oxygen for about 170 hours at 1050 degrees centigrade.

The method may also include, at 422, etching through at least a portion of the mounting substrate to create electrical connection vias. For example, the mounting substrate may be etched from a back side (e.g., a side opposite the resonator structure) to form the vias. In a particular embodiment, when a SOI substrate is used, the vias may extend through the base silicon layer to the silicon oxide layer. The method may also include, at 424, oxidizing walls of the vias to provide electrical insulation. In a particular embodiment, a dry oxide process may be used to oxidize the walls of the vias.

The method may further include, at 426, etching through the vias to the electrodes of the resonator structure. For example, the silicon oxide layer between the electrode bases and the vias may be etched to enable electrical connection through the vias to the electrodes. Metal may be applied to fill the vias and to deposit traces to enable electrical connection through the vias to the electrodes, at 428. Additionally, one or more of the electrodes may be electrically coupled to a control circuit using the vias, at 430. The control circuit may enable sensing and control of the resonator structure.

Figure 5:
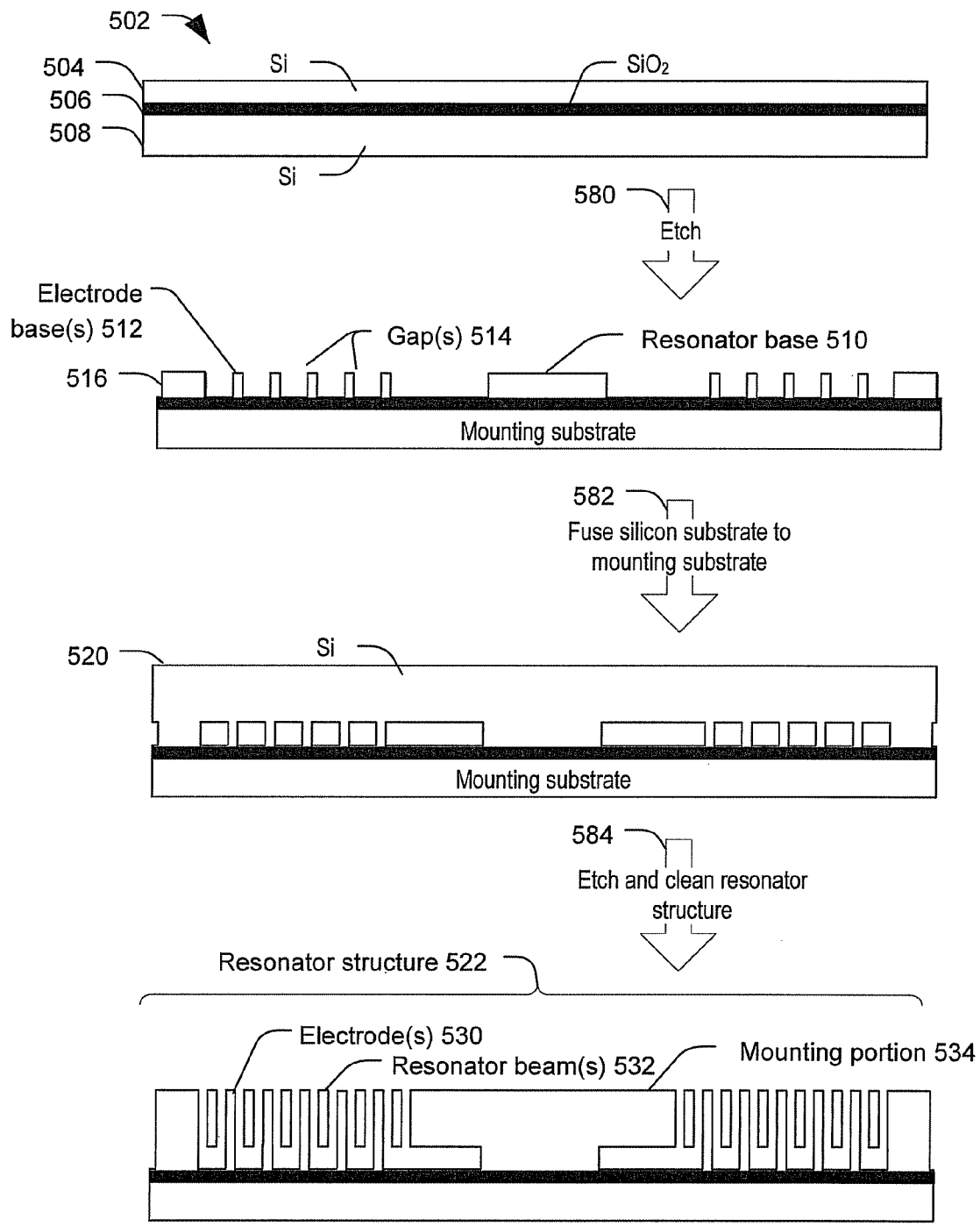
FIGS. 5-7 illustrate a second particular embodiment of a method of forming a resonator.
Figure 6:
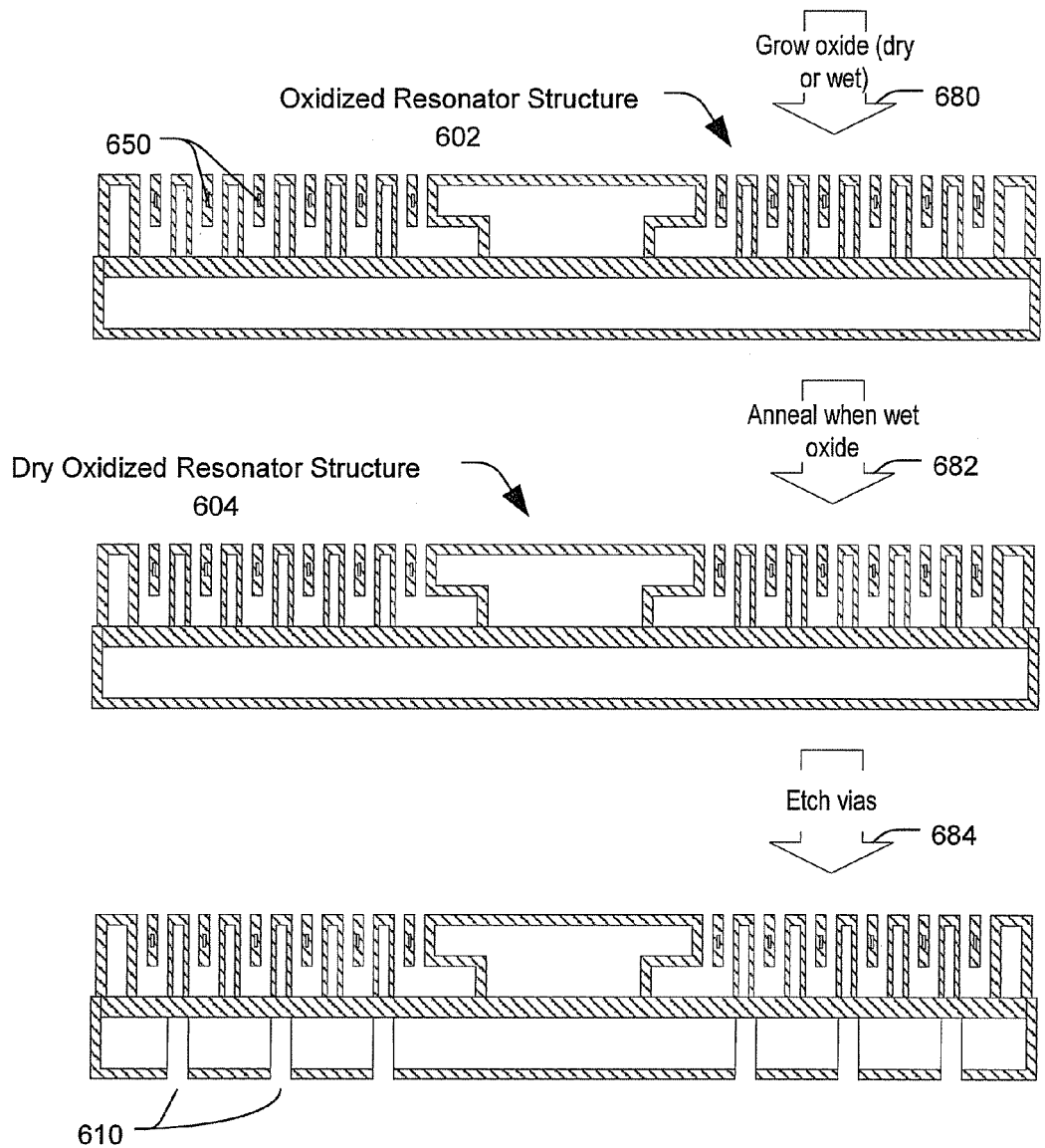
Figure 7:
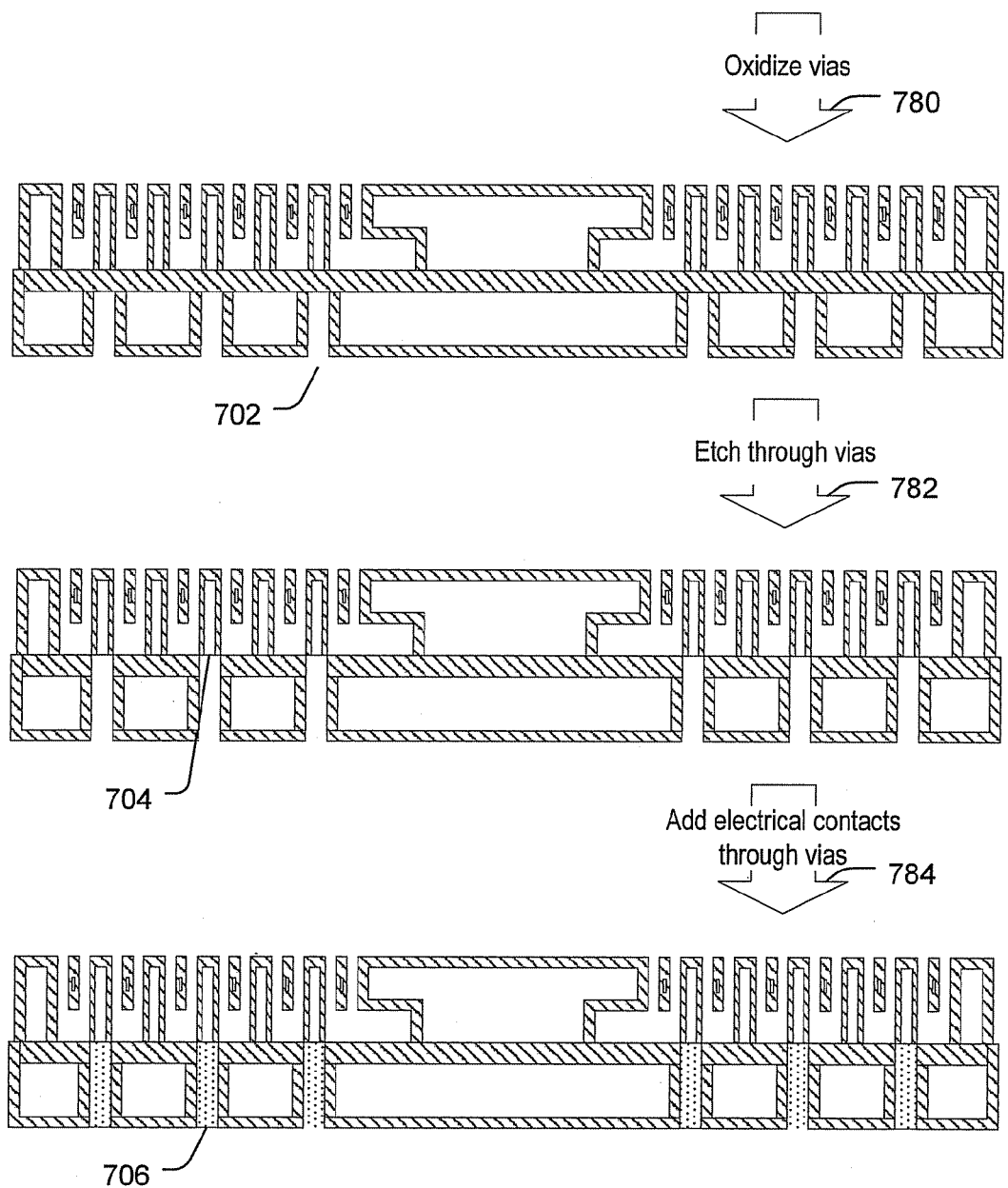

FIGS. 5-7 illustrate a second particular embodiment of a method of forming a resonator. In a particular embodiment, a mounting substrate 502 is provided. The mounting substrate may include a silicon on insulator (SOI) substrate having a top silicon layer 504, an intermediate silicone oxide layer 506 and a base silicon layer 508. At 580, the mounting substrate may be etched. For example, the top silicon layer 504 may be etched to form a resonator base 510 and one or more electrode bases 512 separated by gaps 514. In some embodiments, a cap base 516 may also be formed. The cap base 516 may be used to couple a cap or cover to encapsulate the resonator.

In a particular embodiment, a silicon substrate 520 may be fused to the mounting substrate, at 582. The silicon substrate 520 may be etched and cleaned, at 584, to form a resonator structure 522. For example, the resonator structure 522 may be etched using a dry process, such as a reactive ion etch process, using a wet etch process, using a physical process, or using a combination of processes. The resonator structure 522 may include a pattern, such as the pattern 300 described with reference to FIG. 3, that is etched into or through the silicon substrate 520. To illustrate, the resonator structure 522 may include or be similar to the resonator 100 or the resonator 200 described with reference to FIG. 1 and FIG. 2, respectively. The resonator structure 522 may include resonator beams 532, electrodes 530 and a mounting portion 534.

The method of forming the resonator continues at FIG. 6, where oxide is grown on the resonator structure 522, at 680, to form an oxidized resonator structure 602. The oxide may be grown using a dry oxidation process or a wet oxidation process. In a particular embodiment, an endpoint of the oxidation process may be selected such that the outer portion of at least one of the resonator beams 532 is at least partially oxidized. To illustrate, an interior portion 650 may remain unoxidized forming a relatively thin interior conductive core. For example, an oxide layer formed using the oxidation process may extend through a thickness of about 7-8 μm on all sides of a resonator beam with a thickness of about 25 μm. Thus, the interior conductive core may have a thickness less than about 10 μm. When a dry oxidation process is used, the dry oxidation process may include processing the resonator structure 522 in an oxidation furnace with oxygen as the processing gas at about 1050 degrees centigrade for over 2000 hours to grow about 7-8 μm of dry oxide. When a wet oxidation process is used, the wet oxidation process may include processing the resonator structure 522 in a wet furnace with oxygen and hydrogen as process gases at about 1050 degrees centigrade for about 170 hours to grow about 7-8 μm of wet oxide.

When a dry oxidation process is used, the oxidized resonator structure is a dry oxidized resonator 604; however, when a wet oxidation process is used, the method may include, at 682, annealing the oxidized resonator structure 602 to form the dry oxidized resonator structure 604. The annealing process may reduce water bound to the silicon oxide formed by the wet oxidation process. Additionally, the annealing process may relieve stress induced in the resonator structure 522 by the oxidation process. In an illustrative embodiment, the resonator structure 522 may be annealed in oxygen for about 170 hours at 1050 degrees centigrade.

In a particular embodiment, the mounting substrate 502 may be etched, at 684, to form vias 610. When a SOI substrate is used for the mounting substrate 502, the vias 610 may extend through the base silicon layer 508 to the silicon oxide layer 506.

The method of forming the resonator continues at FIG. 7, where walls of the vias 610 may be oxidized, at 780, to electrical insulate conductors to be deposited in the vias 610 from the mounting substrate 502. The vias 610 may be etched, at 782, to provide access through the vias 610 to one or more of the electrodes 530. At 784, electrical contacts 706 may be added through the vias 610 to the one or more electrodes 530. For example, metal may be deposited to fill the vias 610 to form the electrical contacts 706. In a particular embodiment, the electrical contacts 706 may include electrical traces to enable electrical coupling of the electrodes 530 to a control circuit.

Certain resonators may be formed using silicon in part because silicon fabrication processes tend to be less expensive than fabrication processes used for other materials, such as quartz. Silicon has a coefficient of thermal expansion (CTE) of about 2.6 ppm/C at room temperature. Since a thermoelastic damping effect is proportional to the square of the CTE, silicon resonators may be made with narrower beams than quartz resonators to reduce thermal mass and to increase thermal conductivity. The thermal response achieved in this manner may be more rapid relative to the mechanical frequency of the resonator, allowing the resonator structure to undergo an isothermal process. However, the width of the beams of the resonator may be limited based on the resonator's operational frequency. For example, to maintain a particular frequency, certain structural dimensions of the resonator may be important. Additionally, reducing dimensions of the beams may increase fabrication cost and complexity and make the resonator more susceptible to process variations.

Certain other resonators may be formed using materials with a lower CTE, such as quartz or fused silica. However, selectively etching such materials to form a resonator structure can be time consuming and expensive. Additionally, specialized equipment may be needed to selectively etch vertical patterns in quartz or fused silica, and even using such specialized equipment, aspect ratios of the patterns formed in the material (e.g., the resonator structure) may be relatively low. Further, resonators made by etching quartz or fused silica may rely on external coating to provide electrical connections. Such coatings may include metal or doped silicon with CTE far exceeding that of the substrate materials. Furthermore, such coatings may be applied to the resonator beam surface, where strain energy is concentrated. As a result, energy loss through thermoelastic damping effects in the coating material may be high, significantly reducing the resonator quality factor. But by converting the outer portion of a silicon resonator into dry oxide, a thin conductive inner core may be simultaneously formed, eliminating the need for external coating. Moreover, the conductive core may be positioned near a neutral axis of the resonator beam, where strain energy is minimal. Consequently, energy loss through the conductive material may be reduced as compared to external coatings.

Low cost, high Q factor resonators can be produced using the methods described herein. For example, a resonator may be manufactured from a silicon substrate using relatively low cost silicon fabrication processes, such as reactive ion-etching. The resonator can be converted to a material having a higher Q factor than silicon by oxidizing the resonator after a basic structure of the resonator is formed. In a particular embodiment, the resonator is oxidized until beams of the resonator are at least partially oxidized (e.g., leaving only a thin inner conductive core). The thin inner conductive core may serve as the beams' electrical connection eliminating the need for external coating. Thus, the Q factor of the beams can be increased after the beams are formed using inexpensive manufacturing processes. Using such techniques, resonators with properties close to fused silica can be formed using relatively inexpensive silicon processing techniques.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments disclosed. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather inventive subject matter may be directed to less than all of the features of any of the disclosed embodiments. Thus, the following claims are incorporated into the Detailed Description, with each claim standing on its own as defining separately claimed subject matter.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method, comprising:
   etching a silicon substrate to form a resonator structure, wherein the resonator structure includes at least one resonator beam;
   at least partially converting the at least one resonator beam to dry oxide; and
   etching through at least a portion of a mounting substrate coupled to the silicon substrate to provide electrical connections.

2. The method of claim 1, wherein converting the at least one resonator beam to dry oxide comprises performing a dry oxidization process.

3. The method of claim 1, wherein converting the at least one resonator beam to dry oxide comprises:
   performing a wet oxidization process; and
   annealing the resonator structure.

4. The method of claim 1, further comprising coupling the silicon substrate to the mounting substrate before etching the silicon substrate to form the resonator structure.

5. The method of claim 4, further comprising etching the mounting substrate to form a resonator base to support the resonator structure before coupling the silicon substrate to the mounting substrate.

6. The method of claim 1, wherein the mounting substrate comprises a first silicon layer, an oxide layer and a second silicon layer.

7. The method of claim 1, wherein the at least one resonator beam includes an inner conductive core.

8. A method comprising:
   coupling a silicon substrate to a mounting substrate;
   etching the silicon substrate to form a resonator structure, wherein the resonator structure includes at least one resonator beam;
   at least partially converting the at least one resonator beam to dry oxide; and
   etching a via through the mounting substrate to provide an electrical connection.

9. The method of claim 8, further comprising etching the via through the mounting substrate from a side opposite the silicon substrate after coupling the silicon substrate to the mounting substrate.

10. The method of claim 9, further comprising electrically coupling at least one electrical connection of the resonator structure to a control circuit using the via.

11. The method of claim 8, wherein coupling the silicon substrate to the mounting substrate includes fusing a silicon layer of the mounting substrate to the silicon substrate.

12. The method of claim 8, wherein the at least one resonator beam includes an inner conductive core.

13. The method of claim 8, further comprising using endpoint detection to determine when the at least one resonator beam is substantially converted to an oxide.

14. The method of claim 8, wherein at least one electrode is formed in the silicon substrate concurrently with etching the silicon substrate to form the resonator structure.

15. A method comprising:
   etching a silicon substrate to form a resonator structure, wherein the resonator structure includes circumferential segments; and
   increasing a quality factor of the resonator structure by oxidizing the resonator structure until the circumferential segments are substantially oxidized;
   wherein the circumferential segments are supported by a plurality of radial segments.

16. The method of claim 15, wherein the oxidizing is performed according to an endpoint detection to determine when the circumferential segments have been substantially oxidized.

17. A method comprising:
   etching a silicon substrate to form a resonator structure, wherein the resonator structure includes circumferential segments; and
   increasing a quality factor of the resonator structure by oxidizing the resonator structure until the circumferential segments are substantially oxidized;
   wherein the circumferential segments are concentric, and wherein the resonator structure includes a disc that includes a plurality of slots formed from the circumferential segments.

18. A method comprising:
   etching a silicon substrate to faun a resonator structure, wherein the resonator structure includes circumferential segments;
   increasing a quality factor of the resonator structure by oxidizing the resonator structure until the circumferential segments are substantially oxidized; and
   etching through at least a portion of a mounting substrate coupled to the silicon substrate.

* * * * *